US008337619B2

(12) United States Patent
Carlson et al.

(10) Patent No.: US 8,337,619 B2
(45) Date of Patent: Dec. 25, 2012

(54) POLYMERIC COATING OF SUBSTRATE PROCESSING SYSTEM COMPONENTS FOR CONTAMINATION CONTROL

(75) Inventors: David K. Carlson, San Jose, CA (US); Roger N. Anderson, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1132 days.

(21) Appl. No.: 12/234,038

(22) Filed: Sep. 19, 2008

(65) Prior Publication Data

US 2010/0071622 A1 Mar. 25, 2010

(51) Int. Cl.

| | |
|---|---|
| ***C23C 16/00*** | (2006.01) |
| ***C23C 16/50*** | (2006.01) |
| ***C23F 1/00*** | (2006.01) |
| ***H01L 21/306*** | (2006.01) |

(52) U.S. Cl. ................. 118/715; 156/345.1; 156/345.29

(58) Field of Classification Search .................. 118/715, 118/728–732; 156/345.51–345.55

See application file for complete search history.

(56) References Cited

U.S. PATENT DOCUMENTS

| | | | | |
|---|---|---|---|---|
| 5,622,565 | A * | 4/1997 | Ye et al. | 118/723 R |
| 6,284,006 | B1 * | 9/2001 | Siefering et al. | 29/25.01 |
| 2005/0161158 | A1 * | 7/2005 | Schumacher | 156/345.29 |

FOREIGN PATENT DOCUMENTS

| | | | |
|---|---|---|---|
| EP | 1197994 | A1 | 4/2002 |
| WO | WO 00/74125 | A1 | 12/2000 |

* cited by examiner

*Primary Examiner* — Parviz Hassanzadeh
*Assistant Examiner* — Tiffany Nuckols
(74) *Attorney, Agent, or Firm* — Kilpatrick Townsend & Stockton LLP

(57) ABSTRACT

A method of treating a metal surface of a portion of a substrate processing system to lower a defect concentration near a processed surface of a substrate includes forming a protective coating on the metal surface, wherein the protective coating includes nickel (Ni) and a fluoropolymer. Forming the protective coating on the metal surface can further include forming a nickel layer on the metal surface, impregnating the nickel layer with a fluoropolymer, and removing fluoropolymer from the surface leaving a predominantly nickel surface so the fluoropolymer is predominantly subsurface. A substrate processing system includes a process chamber into which a reactant gas is introduced, a pumping system for removing material from the process chamber, a first component with a protective coating, wherein the protective coating forms a surface of the component which is exposed to an interior of the substrate processing chamber or an interior of the pumping system. The protective coating includes nickel (Ni) and a flouropolymer.

16 Claims, 10 Drawing Sheets

POLYMERIC COATING OF SUBSTRATE PROCESSING SYSTEM COMPONENTS FOR CONTAMINATION CONTROL

CROSS REFERENCE TO RELATED APPLICATIONS

This application is related to International Application No. PCT/JP00/03410 titled "Apparatus for manufacturing semiconductor device," by Kazuyoshi Saito et al., which was published on Dec. 7, 2000 as International Publication No. WO 00/74125 A1, the content of which is incorporated herein by reference in its entirety.

BACKGROUND

This application relates to substrate processing equipment including semiconductor manufacturing equipment, display panel manufacturing equipment and solar panel manufacturing equipment. More particularly, the application relates to improving defect levels of substrate processing equipment.

Substrate processing techniques are sensitive to contamination originating from the interior walls of processing chambers. The walls of pipes and elements of gas handling systems, gas exhaust systems and pumping systems are also sources of particulates and contaminants which may affect the performance of devices formed on substrate surfaces. Particulates which migrate to the substrate surface can interfere with the physical formation of vias, lines, transistors, diodes and other features on a substrate surface. A transfer of contaminants may also result in a change of dopant concentration or metal contamination which can adversely affect the performance of transistors and diodes by altering, even slightly, the chemical composition of the substrate or layers formed on the substrate.

The mobility of particulates and contamination from the interior walls of a substrate processing system is affected by the types of process gases used to process the substrate. Some processes use chlorine containing compounds which are chemically aggressive, reacting with the surfaces of the processing system. Aluminum on or near an exposed surface inside a processing system, for example, may be attacked by hydrogen chloride (HCl) which is a common effluent in, e.g., epitaxial (EPI) deposition systems.

Stainless steel of various types is used for many parts of substrate processing equipment. One type which is commonly found in processing systems is 316L stainless steel due, in part, to a resistance to chlorine corrosion. 316L stainless steel also forms cleaner welds which are more conducive to incorporation in processing equipment.

A primary component of stainless steel is iron (Fe), which can adversely affect substrate processing because the iron oxides are unstable in the presence of HCl. Electropolishing the exposed surfaces of 316L stainless steel results in a reduction in iron content and an improvement in surface smoothness. Some iron remains near the surface. Once the chamber is assembled, the chamber can be seasoned to further reduce the iron. Seasoning involves flowing process gases or process reaction by-products through various regions. For example, flowing HCl through the exhaust system removes additional iron from the surface and near-surface regions of the exposed surfaces of tubes and other components.

Components may also be coated with polymers to cover potential metal contaminants which may otherwise transfer to the substrate surface under process conditions. Coating films such as Teflon (PTFE) or Polyimide give rise to other problems. The coatings typically need to be thicker than the tolerances of the chamber components, necessitating a redesign of some components to enable proper assembly and operation. Thick polymeric coatings also are subject to delamination as a result of gases penetrating tiny holes in the film. Trapped gases then expand and contract during processing and between processing, respectively, prying the film away from the underlying metallic surface. Thermal cycling also stresses the film when the coefficients of thermal expansion of the metal and coating are different. In addition to passive delamination, polymeric coatings typically do not have the physical strength or adhesion characteristics necessary to be used for a dynamic contact, such as a bearing.

BRIEF SUMMARY

Aspects of the disclosure pertain to a thin coating for metal components used in substrate processing. The thin coatings may comprise nickel (Ni) and a fluoropolymer. The coating may be thinner than dimensional tolerances of the metal components and may adhere more strongly than polymeric coatings to the underlying metal surfaces. The coating may result in a reduced exposed polymer to reduce the chance of transferring carbon to the substrate surface. Another advantage of coatings according to disclosed embodiments may be to reduce the porosity thereby reducing the potential for gases to penetrate through the film and compromising the physical integrity of the coating-metal interface. Coatings may exhibit a very smooth surface to slow the accumulation of deposits on the interior walls of chamber components and may be hydrophobic to limit or slow the absorption of water during cleaning procedures. The coatings may have a high lubricity so they can be used in regions of dynamic contact.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

Figure 1:
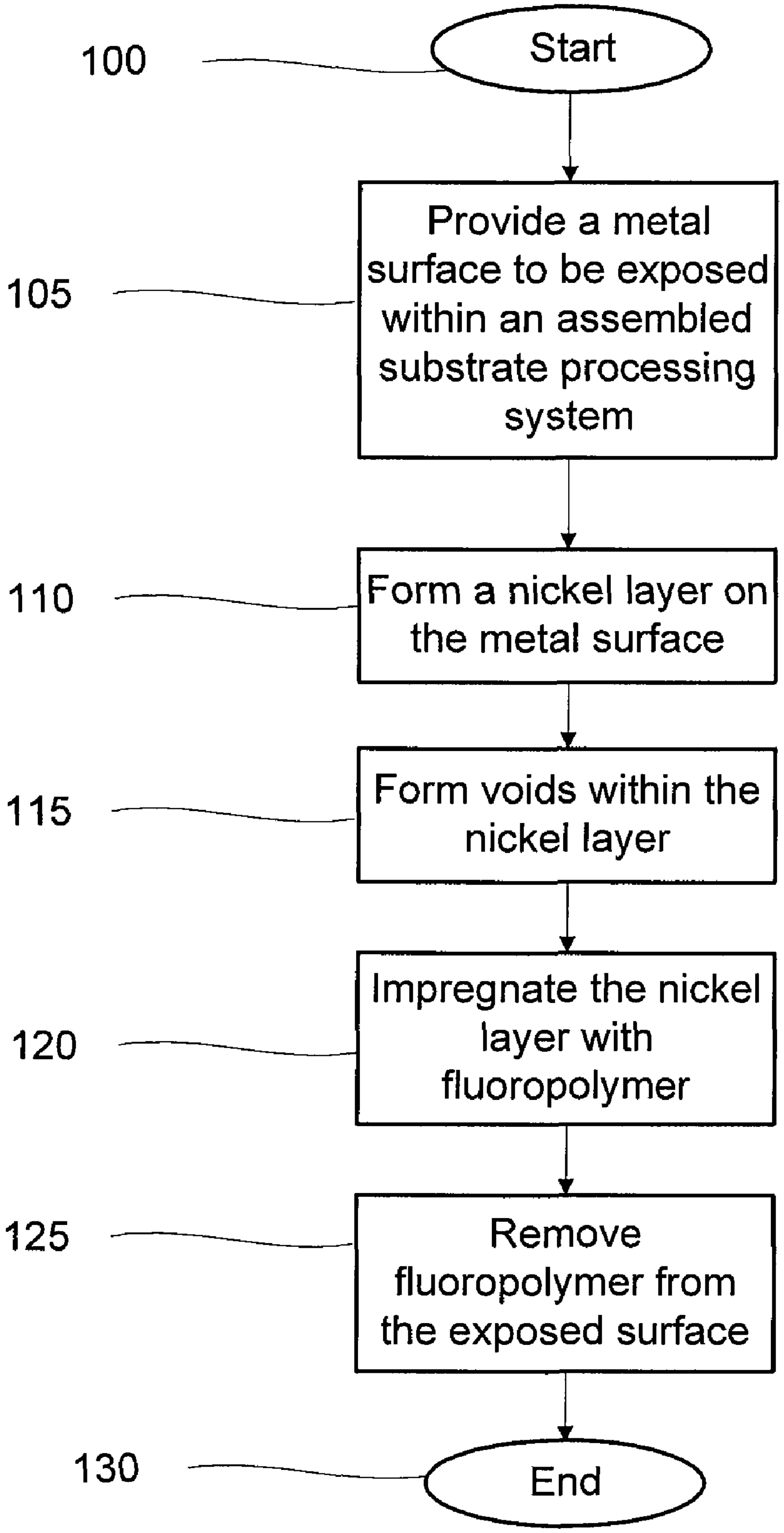
FIG. 1 depicts a flowchart of a formation process of a coating according to disclosed embodiments.

In the appended figures, similar components and/or features may have the same reference label. Where the reference label is used in the specification, the description is applicable to any one of the similar components having the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Aspects of the disclosure pertain to thin protective coatings (and their methods of deposition) for metal components used in substrate processing. The coatings may comprise nickel (Ni) and fluoropolymer and may be thinner than dimensional tolerances of the metal components. The coatings may also adhere to the underlying metal surfaces more strongly than common polymeric coatings. The coatings may possess a reduced exposed polymer to reduce the chance of transferring carbon to the substrate surface. Other advantages of the coatings are a reduced porosity, which reduces the potential for gases to penetrate through the film and compromising the physical integrity of the coating-metal interface. Coatings may exhibit a very smooth surface to slow the accumulation of deposits on the interior walls of chamber components and may be hydrophobic to limit or slow the absorption of water during cleaning procedures. Additional benefits include a high lubricity, which is helpful in regions of dynamic contact.

Certain substrate processing techniques, including chemical vapor deposition (CVD) and epitaxial deposition (EPI) processes, utilize precursors and create effluents which may react readily with some metal chamber components. Subsequent reactions may create particulates and reaction by-products which may relocate to the substrate surface compromising the formation of lithographically defined features and/or contaminating a deposited film or substrate. A thin coating on interior surfaces of chamber components may reduce and/or delay this detrimental redistribution of material. Aspects of disclosed embodiments may provide advantages in other processing steps in a variety of substrate processing industries.

Coatings, according to disclosed embodiments, comprise nickel and a fluoropolymer. Nickel, unlike iron, is relatively stable in an environment involving chlorine containing compounds. The coatings are made by forming a thin porous nickel layer on interior surfaces of chamber components and impregnating the porous nickel layer with a fluoropolymer. The surface of the coating may then be treated to remove exposed fluoropolymer from the surface such that by and large, only nickel is exposed to a process gas or process effluent. Films formed in this manner are found to be hydrophobic. Since pores are filled with fluoropolymers, the permeability of the coating to fluids is lower than current protective films and exposed metal surfaces. One such film suitable for stainless steel is NEDOX® CR+ available from General Magnaplate. Other coatings available from this and other manufacturers use analogous techniques for various steels, aluminum and other substrate processing system component materials. Fluoropolymer impregnated nickel coatings may be hard, chemically inert, self lubricating and hydrophobic. The coatings can tolerate high temperatures and keep coated objects cleaner since the smooth exposed surface accumulates debris more slowly.

FIG. 1 is a flowchart showing the steps used to form a coating comprising nickel and a fluoropolymer in accordance with a disclosed embodiment. The process begins in step 100 where the equipment used to coat the component is initialized. Step 100 can include setting up the process, calibrating the process, etc. Next in step 105 a metal part or a part which has some metal on a surface is provided for coating. The coated surface may be the inside and/or outside of the object and preferably covers at least the portion of the metal which will be exposed to processing conditions within a substrate processing system. In step 110, the metal surface is coated with a layer of nickel. The nickel may be deposited via electroplating or electroless plating in disclosed embodiments. Next in step 115 voids may be formed within the nickel layer with an etching agent. Alternatively, steps 110 and 115 may be combined into one porous nickel deposition step. In step 120 the voids are impregnated with a fluoropolymer which may involve a chemical deposition or a thermal spray of small polymeric particles followed by a heat treatment. Fluoropolymer residing on the outer surface of the nickel layer may be removed (step 125) by chemical etching or a physical removal process. The process ends in step 130 when the completed component is removed from the coating apparatus. Coatings deposited with these methods may be referred to as nickel-fluoropolymer coatings herein.

Nickel-fluoropolymer coatings are found to adhere more resiliently to the stainless steel because the bond is predominantly between two metal layers (the stainless steel alloy and the nickel, rather than directly between the stainless steel and the fluoropolymer. Instances of delamination are significantly reduced. Since the nickel forms an essentially contiguous film with relatively discrete regions for the fluoropolymer, the film resists leakage of process gases through the film to the interface between the coating and the stainless steel.

Preventative maintenance procedures are used in most substrate processing systems to ensure that the percentage of viable finished products remains high enough to maintain profitability. In disclosed embodiments, the coating described above with reference to FIG. 1 improves at least two parameters regarding preventative maintenance procedures that impact the overall efficiency and cost-of-ownership of the processing equipment. One parameter is the mean-time-to-maintenance (MTTM) which may be increased with the coatings described herein. A higher MTTM allows the operation of a processing chamber to continue without interruption for longer intervals. Substrate processing equipment in general, and EPI processing in particular, often require significant time and effort to tune the process such that the process is stable and operating within specifications. Once this time and effort is expended, the substrate processing equipment may run without assistance for extended periods. Therefore, frequent maintenance is undesirable because of time spent tuning the process.

Protective coatings described herein may be thin. The films inherit their surface topology largely from the underlying surfaces. A smooth underlying surface results in a smooth protective layer. The protective coating is also found to exhibit the chemical inert properties characteristic of fluoropolymers despite the fact that the fluoropolymers reside predominantly beneath the surface of the coating. The smoothness and resistance to chemical attack significantly slows the accumulation of debris, increasing the time until a maintenance procedure is needed.

Once the chamber is taken off-line for maintenance, the duration needed for the maintenance procedure and any recovery time may be reduced to further improve overall efficiency and thereby reduce cost-of-ownership. During a maintenance procedure, components may be washed in harsh or mild solvents often in aqueous solutions. Water from the aqueous solutions may penetrate crevices in the components, absorb into the components, or adhere to the surface of the components.

Following the reassembly and before processing substrates, water and other contaminants can be removed from the processing system. In a substrate processing chamber, water may be removed by pumping out the chamber for an extended period of time often in combination with heating the chamber. Due to the chemical nature of water and the relatively high boiling point, reducing the water to acceptable levels can take many hours and sometimes days. A hydrophobic film, such as coatings described herein, applied to the interior surface of the chamber can reduce this time considerably. The protective coatings described herein may be hydrophobic in order to reduce the water present after chamber evacuation and, therefore, reduce the time required to recover from maintenance procedures. In the event that a problem happens to emerge during requalification of the process, the reduction in recovery time makes reopening the process chamber to correct any problems much less forbidding. As a result, tighter requirements may be used for process requalification since the smaller recovery time represents a reduced impact on the productivity of the processing equipment.

Examples and current uses of coatings described herein have been applied to stainless steel 316L. These coatings may also be applied to other types of stainless steel and different materials altogether, e.g. aluminum. Materials which have been avoided in the past may now be used in some rather caustic substrate processing environments, particularly those wherein processes use halogen-containing compounds.

Nickel is used to provide the physical structure of coatings according to disclosed embodiments. As a result, the thicknesses are smaller than traditional polymeric coatings used to protect processing chamber components. The reduced thicknesses of the coatings may be below the design tolerances of many components of substrate processing chambers which reduce the need for redesigning system components. For example, in some embodiments design tolerances will permit coatings to have a thickness ranging between about 3 μm and 40 μm, while in other embodiments with tighter tolerances the thickness can range between about 4 μm and 30 μm. In still other embodiments, where design tolerances are even tighter, the coating thickness may only range between about 5 μm and 20 μm.

Coatings disclosed herein may be used on a wide variety of processing chamber components which are exposed to the process chemicals and reaction byproducts. Components which may benefit from having a coating, as described above with reference to FIG. 1, include components within a processing chamber, components in an exhaust or pumping system and components in a gas handling system, for example.

Figure 2:
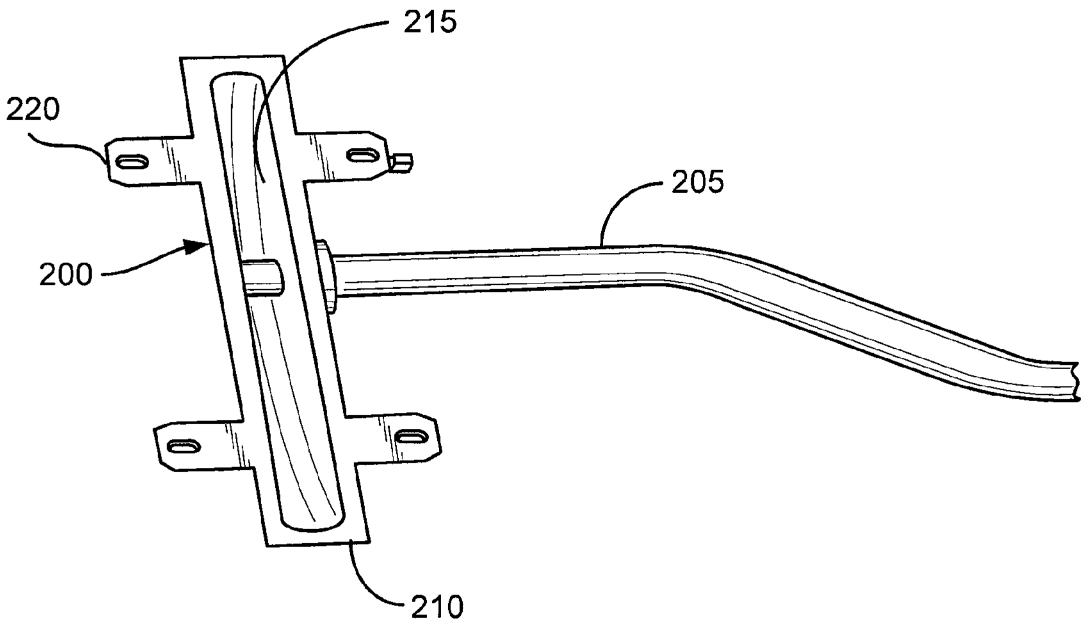
FIG. 2 depicts a perspective view of an exhaust assembly coated according to disclosed embodiments.

FIG. 2 depicts a perspective view of an exhaust assembly 200 including an exhaust pipe 205, an exhaust cap 210 having an interior 215 and extensions 220. The interior 215 of the exhaust cap 210 and the interior of the exhaust pipe 205 may be coated in disclosed embodiments. The exhaust assembly 200 may be fastened to the side of a substrate processing chamber with bolts through the holes in the four stainless steel extensions 220 welded to the exhaust cap 210. Forming a nickel-fluoropolymer coating on the components shown in FIG. 2 and the components depicted in later figures reduces the reaction rate of process gases and effluents with the interior exposed surfaces of the components. The coating also reduces the rate with which material builds up on the interior walls and facilitates cleaning the surfaces during maintenance procedures. The benefits of the coating include an extension of the time between preventative maintenance procedures and a reduction in the risk of particle generation and contamination, ultimately, of a processed substrate.

Figure 3:
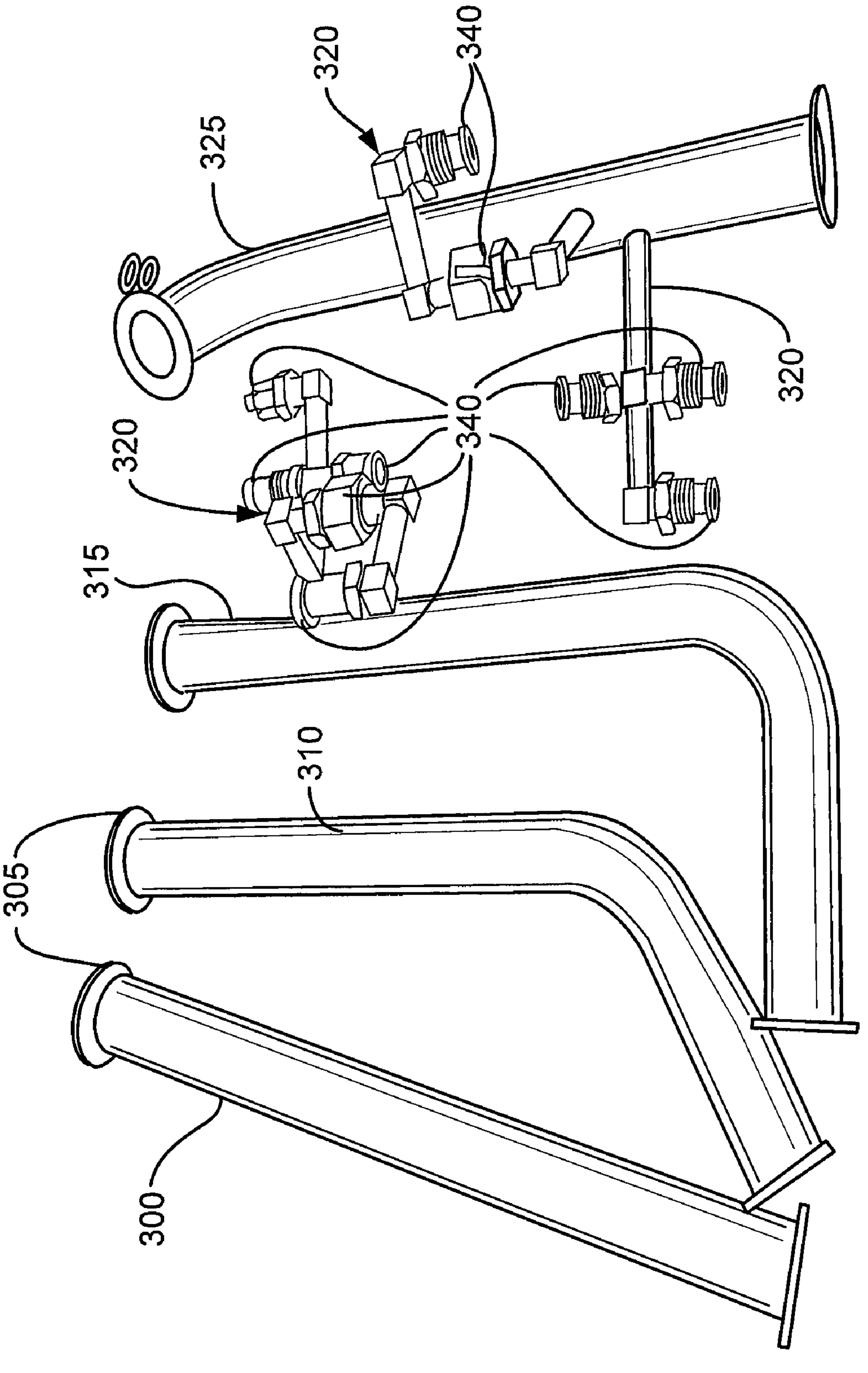
FIG. 3 depicts a perspective view of substrate processing system components coated according to disclosed embodiments.

FIG. 3 depicts a perspective view of substrate processing system components having a nickel-fluoropolymer coating formed according to disclosed embodiments. The interior of a straight length of exhaust pipe 300 may be coated with a nickel-fluoropolymer coating formed according to disclosed embodiments. All the pipes shown in FIG. 3 are shown with quick-release flanges 305 but other flanges may be used. An angled length of exhaust pipe 310 is also shown in FIG. 3. Right-angle exhaust pipes 315, 325 are shown with welded manifolds 320 including smaller pipes and connection locations 340. The connection locations 340 may use compression-style fittings to maintain a separation between the interior of the exhaust manifold and the environment. Valves, gauges, and other components may be connected at the connection locations 340. When welds are used, the weld joint exposed in the interior of the exhaust manifold may also be coated with a nickel-fluoropolymer coating in disclosed embodiments. The coating may be applied after welding steps are complete.

Figure 4:
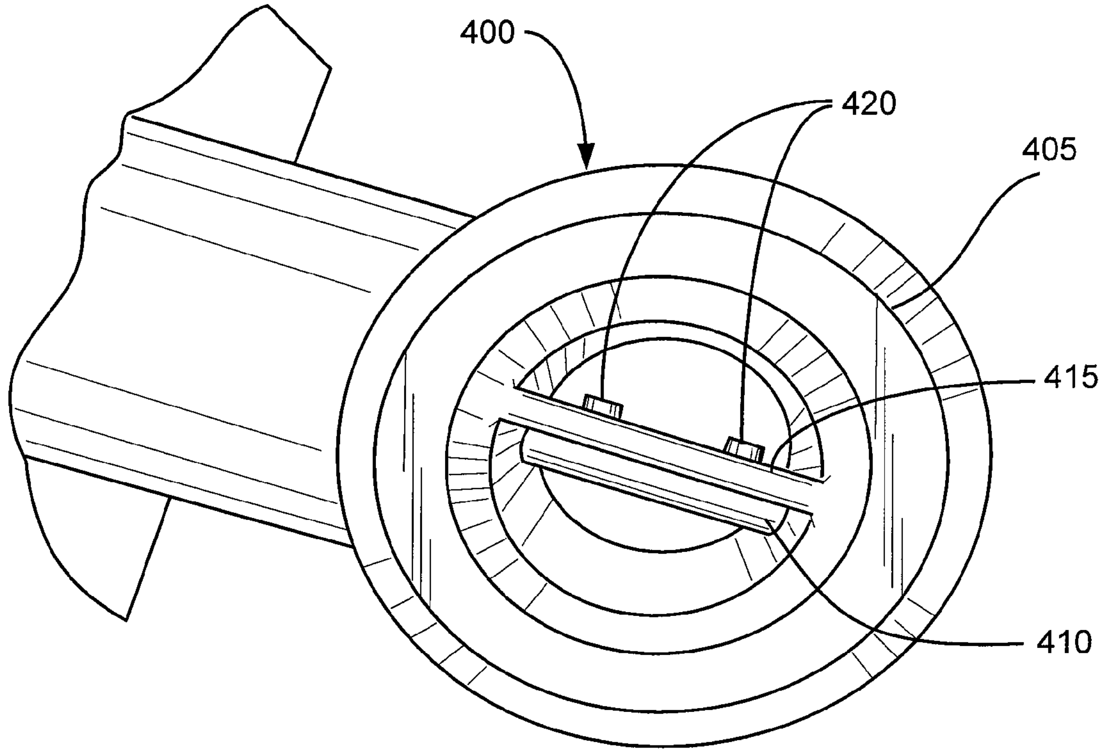
FIG. 4 depicts a perspective view of a butterfly valve coated according to disclosed embodiments.

FIG. 4 depicts a perspective view of a butterfly valve 400. The interior surfaces of the body of the butterfly valve 400 may be coated with a nickel-fluoropolymer coating. The butterfly valve 400 has quick-release flanges 405 on either side of the rotatable seal 410. The rotatable seal 410 is in an open position and may be rotated automatically or manually by rotating the shaft 415 such that the rotatable seal 410 is completely closed or in an intermediate position to throttle a flow rate or a pumping speed. The rotatable seal 410 may be attached to the shaft 415 with stainless bolts or screws 420. Exposed metal portions of the shaft 415, bolts 420 and rotatable seal 410 may be coated with a nickel fluorpolymer coating in addition to the interior of the body of the butterfly valve 400. Portions of the valve may endure friction with other parts. This is usually the case with the seal portion of the rotatable seal 410 but may also occur at the support ends of the shaft 415. When relative motion occurs between two contacting surfaces, the nickel-fluoropolymer coatings according to disclosed embodiments offer additional benefits. The impregnated fluoropolymer exhibits a high lubricity. The friction is reduced, reducing particle generation and the potential for contamination. The high lubricity may increase the lifespan of the butterfly valve or components therein by decreasing the friction created by the contact. The nickel-fluoropolymer coating may be applied to one or both contacting surfaces near where the friction occurs in different embodiments. In some cases, the coating may be applied to a metal surface which experiences friction with a nonmetallic surface.

Figure 5:
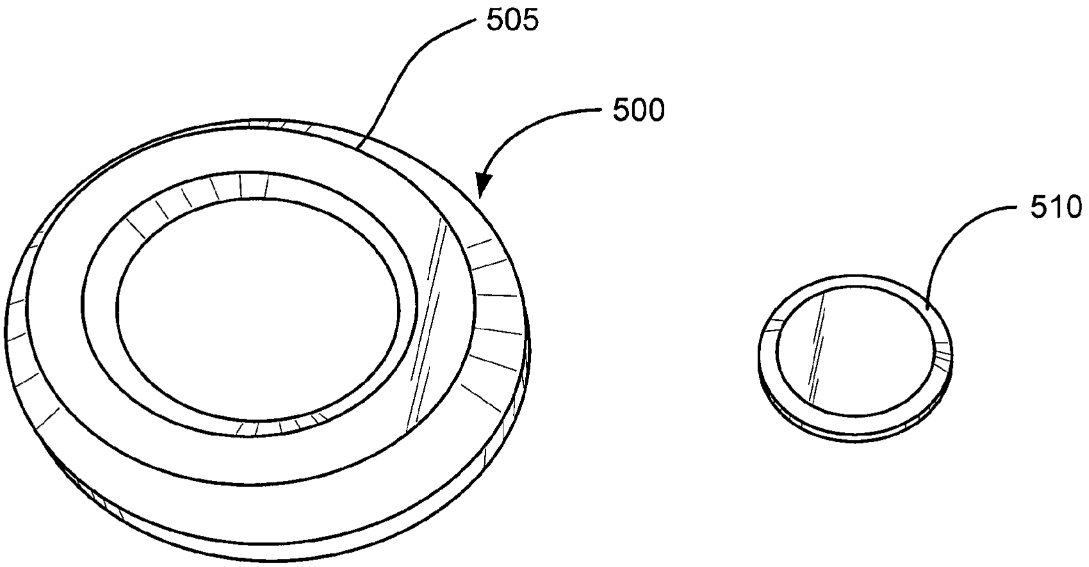
FIG. 5 depicts a perspective view of a disassembled pressure control valve coated according to disclosed embodiments.

FIG. 5 depicts a perspective view of a disassembled pressure control valve having portions coated with a nickel-fluoropolymer coating formed according to disclosed embodiments. The body of the valve 500 is attached to a quick-release flange 505. A plunger 510 is shown next to the body of the valve 505. Upon assembly, the plunger 510 can be pressed against a mating surface with a selectable force in order to allow flow after a pressure difference between one side of the pressure control valve and the other exceeds a threshold level. The surface of the plunger 510 contacts the mating surface creating a dynamic contact. This dynamic contact, wherein one or both of the contacting surfaces are metal, may generate fewer particles and less contamination when one or both of the contacting surfaces are coated with a nickel-fluoropolymer coating.

Figure 6:
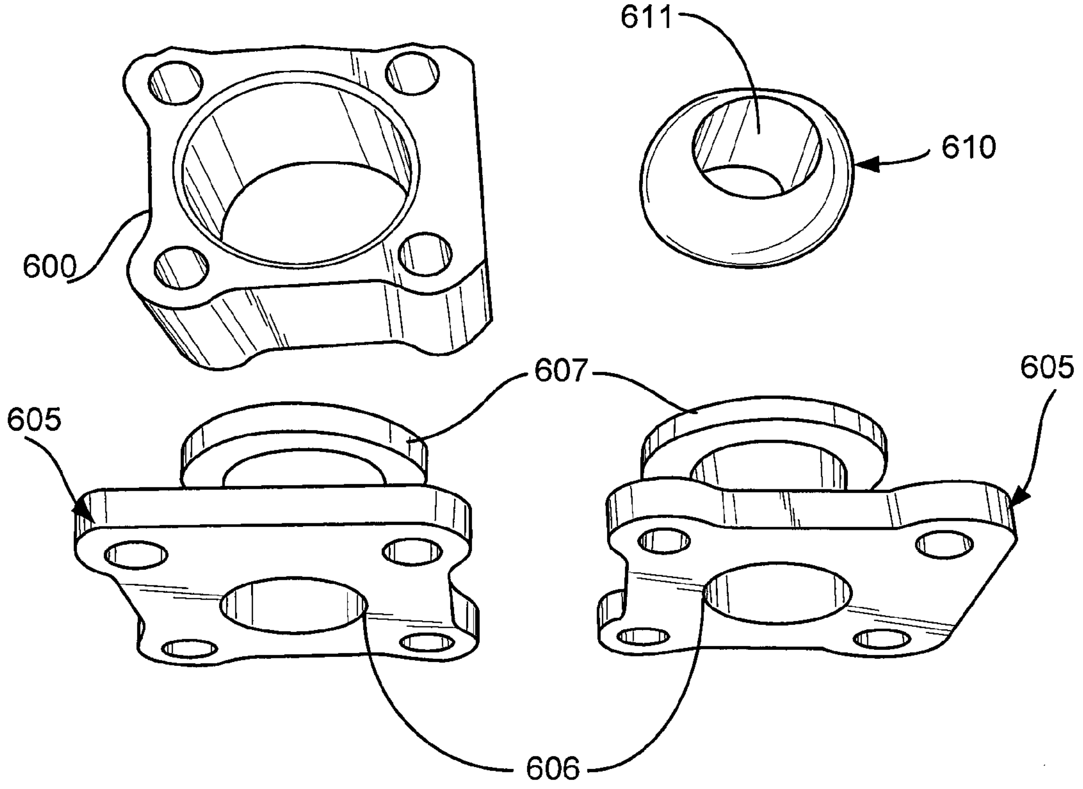
FIG. 6 depicts a perspective view of a disassembled ball valve coated according to disclosed embodiments.
Figure 7:
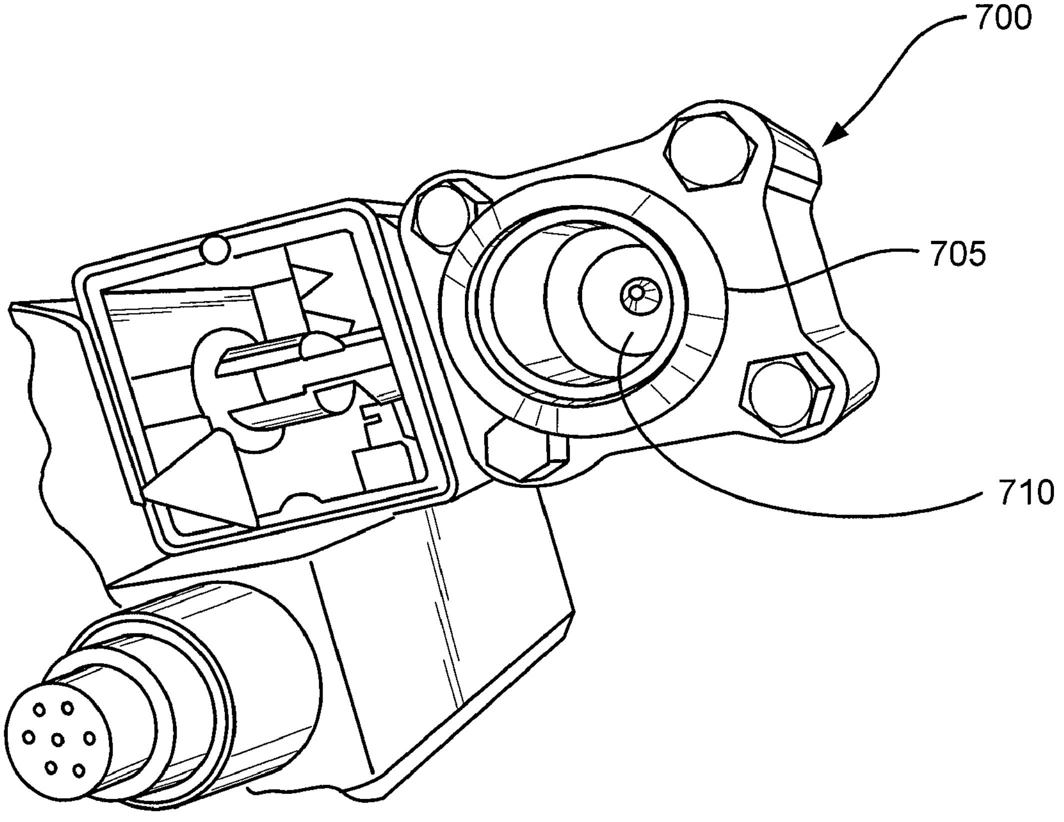
FIG. 7 depicts a perspective view of an assembled ball valve coated according to disclosed embodiments.

FIG. 6 depicts a perspective view of a disassembled ball valve, which may be used as a vacuum isolation valve, and has portions coated with a nickel-fluoropolymer coating formed according to disclosed embodiments. The disassembled ball valve includes a body 600, two adapters 605 each having a surface 606, two quick-releases flanges 607, a ball 610 with an interior 611. In one embodiment, the interior of the ball 611 may be coated with a nickel-fluoropolymer coating to prevent contamination resulting from gas that is flowed through the hole. In another embodiment, the entire ball 610 including the interior of the ball 611 is coated with a nickel-fluoropolymer coating. The exterior of the ball 610 may be coated because when the ball 610 is in the closed position, a portion of the exterior of the ball 610 may be exposed to process gases or process effluents. Interior portions of the body 600 as well as the adapters 605 may also be coated with a nickel-fluoropolymer coating. The coating can be done prior to assembly. Since the surfaces 606 of the adapters 605 may experience friction with the outer surface of the ball 610, when the ball 610 is rotated from an open to a closed position (or an intermediate location for the purpose of throttling), coating one or both surfaces with the high lubricity nickel-fluoropolymer coating helps reduce particle generation and the chance for contamination. In embodiments, the outer surface of the ball 610 and surface of an adapter 606 make contact to form a seal. FIG. 7 depicts a perspective view of an assembled ball valve 700. The ball 710, which is seen through the flange 705, is shown in the closed position.

Figure 8:
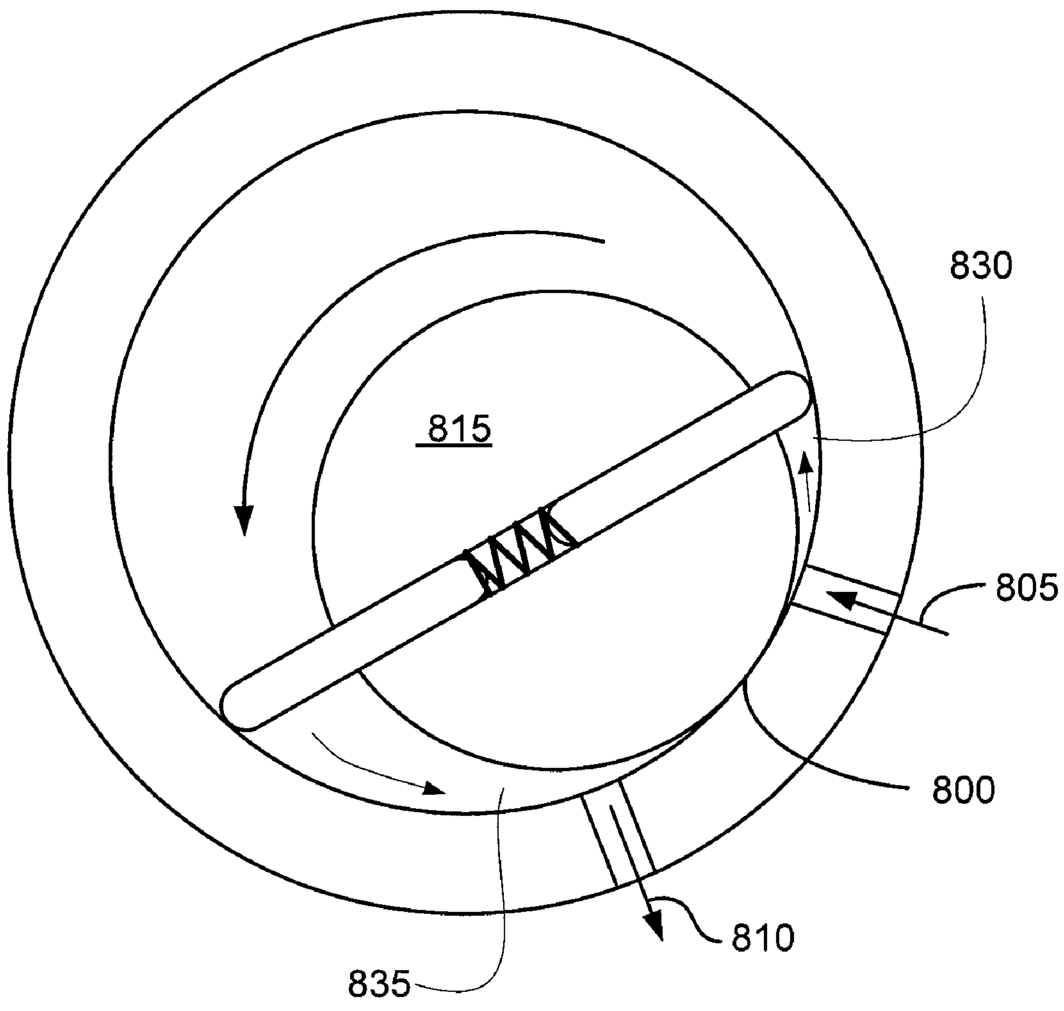
FIG. 8 depicts a schematic of a pump coated according to disclosed embodiments.

FIG. 8 depicts a schematic of a rotary-vane pump which may be used to remove material from a substrate processing chamber and may be partially or entirely coated with a nickel-fluoropolymer coating formed according to disclosed embodiments. An inlet 805 accepts material into an expansion region 830 which is later compressed in a compression region 835 and pushed out or exhausted through an outlet 810 as a rotor 815 turns. The rotor 815 and the body of the pump make a dynamic contact 800. The line along the dynamic contact serves as a seal to separate the compression region 835 from the expansion region 830. The dynamic contact 800 may be a contact between two metal surfaces and exhibit mutual dynamic friction when the rotary-vane pump is operated. One or both metal surfaces may be coated with a nickel-fluoropolymer coating formed according to disclosed embodiments and exhibit improved wear characteristics, lower temperature, and generate less contamination than uncoated surfaces. Other pumps, e.g. roots, claw, screw and scroll-type pumps, could also be coated to provide similar benefits.

The embodiments disclosed herein focus on elements of the exhaust manifold which, in the current state of the art, often determine the frequency of a preventative maintenance schedule. These coatings may also find utility when formed on components within the processing chamber or in the gas handling system.

Exemplary Systems

Figure 9:
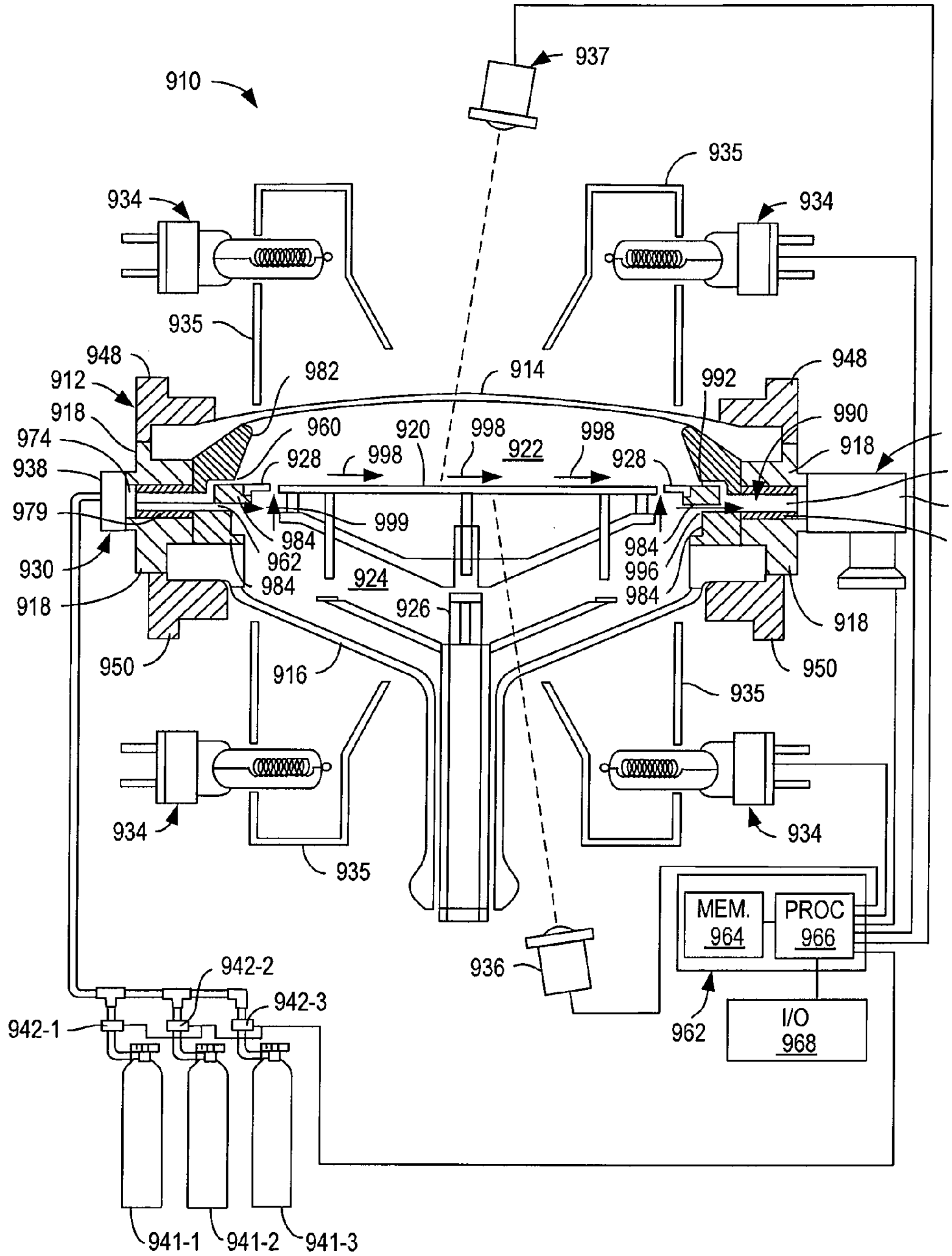
FIG. 9 is a cross-sectional view of a substrate processing system which benefits from coatings according to disclosed embodiments.
Figure 10:
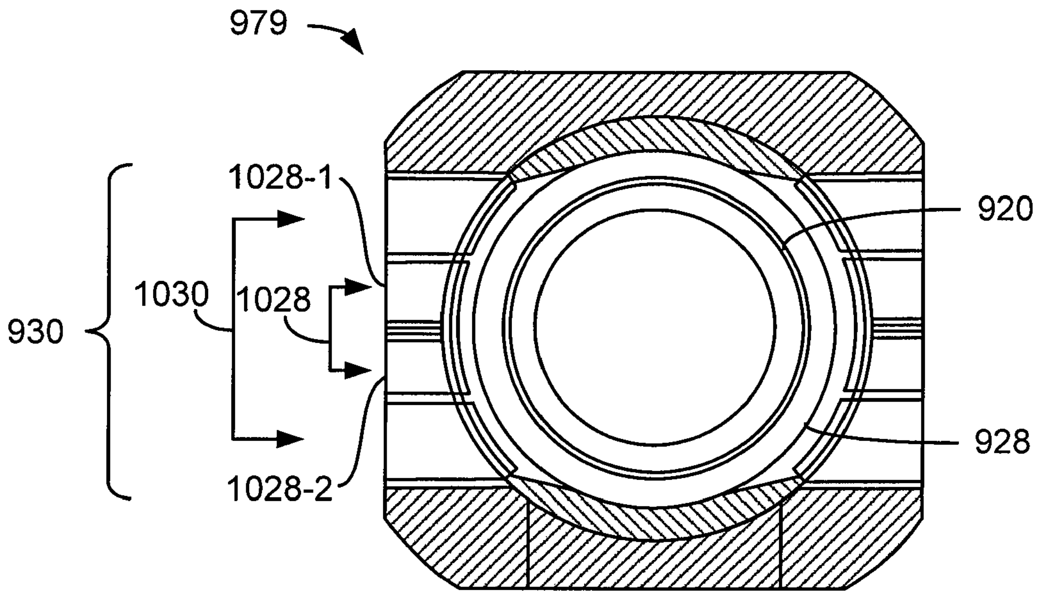
FIG. 10 is a top view of a portion of a substrate processing system which benefits from coatings according to disclosed embodiments.

FIGS. 9-10 show an example of a substrate processing system according to embodiments of the invention. The processing apparatus 910 shown in FIG. 9 is a deposition reactor and includes a deposition chamber 912 having an upper dome 914, a lower dome 916 and a sidewall 918 between the upper and lower domes 914 and 916. Cooling fluid (not shown) may be circulated through sidewall 918 to cool o-rings used to seal domes 914 and 916 against sidewall 918. An upper liner 982 and a lower liner 984 are mounted against the inside surface of sidewall 918. The upper and lower domes 914 and 916 are made of a transparent material to allow heating light to pass through into the deposition chamber 912.

Within the chamber 912 is a flat, circular pedestal 920 for supporting a wafer in a horizontal position. The pedestal 920 can be a susceptor or other wafer supporting structure and extends transversely across the chamber 912 at the sidewall 918 to divide the chamber 912 into an upper portion 922 above the pedestal 920 and a lower portion 924 below the pedestal 920. The pedestal 920 is mounted on a shaft 926 which extends perpendicularly downward from the center of the bottom of the pedestal 920. The shaft 926 is connected to a motor (not shown) which rotates shaft 926 and thereby rotates the pedestal 920. An annular preheat ring 928 is connected at its outer periphery to the inside periphery of lower liner 984 and extends around the pedestal 920. The preheat ring 928 occupies nearly the same plane as the pedestal 920 with the inner edge of the preheat ring 928 separated by a gap from the outer edge of the pedestal 920.

An inlet manifold 930 is positioned in the side wall 918 of chamber 912 and is adapted to admit gas from a source of gas or gases, such as tanks 941, into the chamber 912. The flow of gases from tanks 941 are preferably independently controlled with manual valves and computer controlled flow controllers 942. An exhaust cap 932 is positioned in the side of chamber 912 diametrically opposite the inlet manifold 930 and is adapted to exhaust gases from the deposition chamber 912.

A plurality of high intensity lamps 934 is mounted around the chamber 912 and directs their light through the upper and lower domes 914, 916 onto the pedestal 920 (and preheat ring 928) to heat the pedestal 920 (and preheat ring 928). Pedestal 920 and preheat ring 928 are made of a material, such as silicon carbide, coated graphite which is opaque to the radiation emitted from lamps 934 so that they can be heated by radiation from lamps 934. The upper and lower domes 914, 916 are made of a material which is transparent to the light from the lamps 934, such as clear quartz. The upper and lower domes 914, 916 are generally made of quartz because quartz is transparent to light of both visible and IR frequencies. Quartz exhibits a relatively high structural strength and is chemically stable in the process environment of the deposition chamber 912. Although lamps are the preferred means for heating wafers in deposition chamber 912, other methods may be used such as resistance heaters and RF inductive heaters. An infrared temperature sensor 936 such as a pyrometer is mounted below the lower dome 916 and faces the bottom surface of the pedestal 920 through the lower dome 916. The temperature sensor 936 is used to monitor the temperature of the pedestal 920 by receiving infra-red radiation emitted from the pedestal 920. A temperature sensor 937 for measuring the temperature of a wafer may also be present in some disclosed embodiments.

An upper clamping ring 948 extends around the periphery of the outer surface of the upper dome 914. A lower clamping ring 950 extends around the periphery of the outer surface of the lower dome 916. The upper and lower clamping rings 948, 950 are secured together so as to clamp the upper and lower domes 914 and 916 to the side wall 918.

Reactor 910 includes a gas inlet manifold 930 for feeding process gases into chamber 912. Gas inlet manifold 930 includes a connector cap 938, a baffle 974, an insert plate 979 positioned within sidewall 918, and a passage 960 formed between upper liner 982 and lower liner 984. Passage 960 is connected to the upper portion 922 of chamber 912. Process gas from gas cap 938 passes through baffle 974, insert plate 979 and passage 960 and into the upper portion 922 of chamber 912.

Reactor 910 also includes an independent inert gas inlet 962 for feeding an inert purge gas, such as but not limited to, hydrogen ($H_2$) and nitrogen ($N_2$), into the lower portion 924 of deposition chamber 912. As shown in FIG. 9, inert purge gas inlet 962 can be integrated into gas inlet manifold 930, if preferred, as long as a physically separate and distinct passage 962 through baffle 974, insert plate 979, and lower liner 984 is provided for the inert gas, so that the inert purge gas can be controlled and directed independent of the process gas. Inert purge gas inlet 962 need not necessarily be integrated or positioned along with gas inlet manifold 930, and can for example be positioned on reactor 910 at an angle of 90° from deposition gas inlet manifold 930.

Reactor 910 also includes a gas outlet 932 which incorporates components that can be coated with the nickel-fluoropolymer coating according to the process flows described herein (an example of which is depicted in FIG. 1). The gas outlet 932 includes an exhaust passage 990, which can be coated with a nickel-fluoropolymer coating, which extends from the upper chamber portion 922 to the outside diameter of sidewall 918. Exhaust passage 990 includes an upper passage 992, which can also be coated with a nickel-fluoropolymer coating, and is formed between upper liner 982 and lower liner 984 and which extends between the upper chamber portion 922 and the inner diameter of sidewall 918. Additionally, exhaust passage 990 includes an exhaust channel 994, which can also be coated with a nickel-fluoropolymer coating, that is formed within insert plate 979 positioned within sidewall 918. A vacuum source, such as a pump (not shown) for removing material from chamber 912 is coupled to exhaust channel 994 on the exterior of sidewall 918 by an outlet pipe 933, which can also be coated with a nickel-fluoropolymer coating. Thus, process gas fed into the upper chamber portion 922 is exhausted through the upper passage 992, through exhaust channel 994 and into outlet pipe 933.

The single wafer reactor shown in FIG. 9 is a “cold wall” reactor. That is, sidewall 918 and upper and lower liners 982 and 984, respectively, are at a substantially lower temperature than preheat ring 928 and pedestal 920 (and a wafer placed thereon) during processing. For example, in a process to deposit an epitaxial silicon film on a wafer, the pedestal and wafer are heated to a temperature of between 550-1200° C., while the sidewall (and liners) are at a temperature of about 400-600° C. The sidewall and liners are at a cooler temperature because they do not receive direct irradiation from lamps 934 due to reflectors 935, and because cooling fluid is circulated through sidewall 918. Upper liner 982 and lower liner 984 can also be coated with a nickel-fluoropolymer coating.

Gas outlet 932 also includes a vent 996, which can also be coated with a nickel-fluoropolymer coating, and which extends from the lower chamber portion 924 through lower liner 984 to exhaust passage 990. Vent 996 preferably intersects the upper passage 992 of exhaust passage 990 as shown in FIG. 9. Inert purge gas is exhausted from the lower chamber portion 924 through vent 996, through a portion of upper chamber passage 992, through exhaust channel 994, and into outlet pipe 933. Vent 996 allows for the direct exhausting of purge gas from the lower chamber portion to exhaust passage 990.

According to the present invention, process gas or gases 998 are fed into the upper chamber portion 922 from gas inlet manifold 930. A process gas, according to the present invention, is defined as a gas or gas mixture which acts to remove, treat, or deposit a film on a wafer or a substrate placed in chamber 912. According to the present invention, a process gas comprising a halogen-containing etch gas (examples include HCl vapor, $Cl_2$, $F_2$, $ClF_3$, . . . and/or combinations) and an inert gas, such as $H_2$, is used to treat a silicon surface by removing and smoothing the silicon surface. In an embodiment of the present invention a process gas is used to deposit a silicon epitaxial layer on a silicon surface of a wafer placed on pedestal 920 after the silicon surface has been treated. The process gas 998 generally includes a silicon source, such as but not limited to, monosilane, trichlorosilane, dichlorosilane, and tetrachlorosilane, methyl-silane, and a dopant gas source, such as but not limited to phosphine, diborane, germane, and arsine, among others, as well as other process gases such as oxygen, methane, ammonia, etc. A carrier gas, such as $H_2$, is generally included in the deposition gas stream. For a process chamber with a volume of approximately 5 liters, a deposition process gas stream between 35-75 SLM (including carrier gas) is typically fed into the upper chamber portion 922 to deposit a layer of silicon on a wafer. The flow of process gas 998 is essentially a laminar flow from inlet passage 960, across preheat ring 928, across pedestal 920 (and wafer), across the opposite side of preheat ring 928, and out exhaust passage 990. The process gas is heated to a deposition or process temperature by preheat ring 928, pedestal 920, and the wafer being processed. In a process to deposit an epitaxial silicon layer on a wafer, the pedestal 920 and preheat ring 928 are heated to a temperature of between 550° C.-1200° C. A silicon epitaxial film can be formed at temperatures as low as 550° C. with silane by using a reduced deposition pressure. Higher order silanes can be used at even lower temperatures.

Additionally, while process gas is fed into the upper chamber portion, an inert purge gas or gases 999 are fed independently into the lower chamber portion 924. An inert purge gas is defined as a gas which is substantially unreactive at process temperatures with chamber features and wafers placed in deposition chamber 912. The inert purge gas is heated by preheat ring 928 and pedestal 920 to essentially the same temperature as the process gas while in chamber 912. Inert purge gas 999 is fed into the lower chamber portion 924 at a rate which develops a positive pressure within lower chamber portion 924 with respect to the process gas pressure in the upper chamber portion 922. Process gas 998 is therefore prevented from seeping down through gap and into the lower chamber portion 924, and depositing on the backside of pedestal 920.

Processing apparatus 910 shown in FIG. 9 includes a system controller 962 which controls various operations of apparatus 910 such as controlling gas flows, substrate temperature, and chamber pressure. In an embodiment of the present invention the system controller 962 includes a hard disk drive (memory 964), a floppy disk drive and a processor 966. The processor contains a single board computer (SBC), analog and digital input/output boards, interface boards and stepper motor controller board. Various parts of processing apparatus 910 may conform to the Versa Modular Europeans (VME) standard which defines board, card cage, and connector dimensions and types. The VME standard also defines the bus structure having a 16-bit data bus and 24-bit address bus.

System controller 962 controls the activities of the apparatus 910. The system controller executes system control software, which is a computer program stored in a computer-readable medium such as a memory 964. Memory 964 may be a hard disk drive, but memory 964 may also be other kinds of memory. Memory 964 may also be a combination of one or more of these kinds of memory. The computer program includes sets of instructions that dictate the timing, mixture of gases, chamber pressure, chamber temperature, lamp power levels, pedestal position, and other parameters of a particular process. Of course, other computer programs such as one stored on another memory device including, for example, a floppy disk or another appropriate drive, may also be used to operate system controller 962. Input/output (I/O) devices 968 such as an LCD monitor and a keyboard are used to interface between a user, instrumentation and system controller 962.

FIG. 10 shows a portion of the gas inlet manifold 930 which supplies gas to the upper zone of the processing chamber. In certain embodiments, portions of the gas inlet manifold which are in contact with process gas can also be coated with a nickel-fluoropolymer coating. The insert plate 979 of FIG. 10 is shown to be constituted by an inner zone 1028 and an outer zone 1030. According to this embodiment of the invention the composition of the process gas which flows into inner zone 1028 can be controlled independently of the composition of the gas which flows into outer zone 1030. In addition, the flow rate of the gas to either of the two halves 1028-1, 1028-2 of the inner zone 1028 can be further controlled independently from one another. This provides two degrees of control for the gas flow for the purposes of controlling the composition of the process gas mix over different zones of the semiconductor wafer.

In one embodiment, a method of treating a metal surface of a body having a first plurality of dimensions that meet a specification within design tolerances such that the body fits as part of an apparatus, includes forming a protective coating on the metal surface, wherein the protective coating includes nickel (Ni) and a fluoropolymer. The body and the protective coating have a second plurality of dimensions that meet the specification within the design tolerances such that the body with the protective coating fits as part of the apparatus. Forming the protective coating on the metal surface can further include forming a nickel layer on the metal surface, impregnating the nickel layer with a fluoropolymer, and removing fluoropolymer from the surface leaving a predominantly nickel surface so the fluoropolymer is predominantly subsurface. The body can be an exhaust assembly and the apparatus can be a semiconductor processing system. When the protective coating is used on a body in a substrate processing system, the protective coating can act to lower a defect concentration near a processed surface of a substrate.

In yet another embodiment, the protective coating is less than 100 μm thick.

In yet another embodiment, the protective coating is between about 3 μm and 40 μm thick.

In yet another embodiment, the protective coating is between about 4 μm and 30 μm thick.

In yet another embodiment, the protective coating is between about 5 μm and 20 μm thick.

In yet another embodiment, the portion of the substrate processing system includes a portion of an exhaust assembly.

In another embodiment, an apparatus for use in a semiconductor processing system includes a body having a first plurality of dimensions that meet a specification within design tolerances such that the body fits within the semiconductor processing system, a protective coating having a thickness deposited over a surface of the body, wherein the protective coating includes nickel and flouropolymer, wherein the body and the protective coating have a second plurality of dimensions that meet the specification within the design tolerances such that the body with the protective coating fits within the semiconductor processing system. The protective coating can also be less than 100 μm thick. For example in one embodiment the protective coating is between about 3 μm and 40 μm thick, whereas in another embodiment the protective coating is between about 4 μm and 30 μm thick, whereas in another embodiment the protective coating is between about 5 μm and 20 μm thick.

In yet another embodiment, the surface of the body is metal and the protective coating lowers a defect concentration near a processed surface of a substrate.

In yet another embodiment, the body includes a portion of an exhaust assembly.

In another embodiment, a substrate processing system includes a process chamber into which a reactant gas is introduced, a pumping system for removing material from the process chamber, a first component with a protective coating, wherein the protective coating forms a surface of the component which is exposed to an interior of the substrate processing chamber or an interior of the pumping system. The protective coating includes nickel (Ni) and a flouropolymer. The protective coating can also be less than 100 μm thick. For example in one embodiment the protective coating is between about 3 μm and 40 μm thick, whereas in another embodiment the protective coating is between about 4 μm and 30 μm thick, whereas in another embodiment the protective coating is between about 5 μm and 20 μm thick.

In yet another embodiment, the first component has a first plurality of dimensions that meet a specification within design tolerances such that the first component fits within a second component of the semiconductor processing system. Additionally, the first component with the protective coating has a second plurality of dimensions that meet the same specification within the same design tolerances such that the first component with the protective coating fits within the same second component of the same semiconductor processing system.

In yet another embodiment, the protective coating is a nickel film that is impregnated with the fluoropolymer.

In yet another embodiment, the first component can be an exhaust cap with a protective coating.

In yet another embodiment, the first component can be an exhaust pipe with a protective coating. The exhaust pipe can include a pressure measurement exhaust pipe with a protective coating.

In yet another embodiment, the first component can be a valve assembly with a protective coating. The valve assembly can include an isolation valve assembly with a protective coating or a pressure control valve assembly with a protective coating.

In yet another embodiment, the substrate processing system can include a second component, wherein the first component and the second component have at least one point of contact and experience a mutual dynamic friction. The first component has the protective coating near the at least one point of contact. The second component can also have a protective coating including nickel (Ni) and a fluoropolymer, near the at least one point of contact.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A component for use in an apparatus comprising:

a body having a first plurality of dimensions that meet a specification within design tolerances such that the body fits within the apparatus, wherein the component is an exhaust assembly and the apparatus is a semiconductor processing system;

a protective coating comprising an exposed surface and a layer of thickness deposited over a surface of the body, wherein the protective coating comprises a nickel layer and impregnated with a fluoropolymer, and a fluoropolymer, and a concentration of the nickel is higher at the exposed surface than within the layer of thickness;

wherein the body and the protective coating have a second plurality of dimensions that meet the specification within the design tolerances such that the body with the protective coating fits within the apparatus.

2. The component of claim 1 wherein the apparatus is a substrate processing system.

3. The component of claim 1 wherein the surface of the body is metal and the protective coating lowers a defect concentration near a processed surface of a substrate.

4. The component of claim 1 wherein the protective coating is less than 100 μm thick.

5. The component of claim 1 wherein the protective coating is between about 3 μm and 40 μm thick.

6. The component of claim 1 wherein the protective coating is between about 4 μm and 30 μm thick.

7. The component of claim 1 wherein the protective coating is between about 5 μm and 20 μm thick.

8. A substrate processing system comprising:

a process chamber into which a reactant gas is introduced;

a pumping system for removing material from the process chamber;

a first component with a protective coating; wherein the protective coating comprises an exposed surface and a layer of thickness to form a surface on the component which is exposed to an interior of the substrate processing chamber or an interior of the pumping system, wherein the component is an exhaust assembly and the substrate processing system is semiconductor processing system;

wherein the protective coating comprises a nickel (Ni) layer impregnated with fluoropolymer, and a concentration of the nickel is higher at the exposed surface than within the layer of thickness.

9. The substrate processing system of claim 8 wherein:

the first component has a first plurality of dimensions that meet a specification within design tolerances such that the first component fits within a second component of the semiconductor processing system; and the first component with the protective coating has a second plurality of dimensions that meet the specification within the design tolerances such that the first component with the protective coating fits within the second component of the semiconductor processing system.

10. The substrate processing system of claim 8 wherein the protective coating is less than 100 μm thick.

11. The substrate processing system of claim 8 wherein the protective coating is between about 3 μm and 40 μm thick.

12. The substrate processing system of claim 8 wherein the first component comprises a component selected from the group consisting of an exhaust cap, an exhaust pipe and a valve assembly.

13. The substrate processing system of claim 12 wherein the exhaust pipe comprises a pressure measurement exhaust pipe.

14. The substrate processing system of claim 12 wherein the valve assembly comprises a valve assembly selected from the group consisting of an isolation valve assembly and a pressure control valve assembly.

15. The substrate processing system of claim 8 further comprising:

a second component, wherein the first component and the second component have at least one point of contact and experience a mutual dynamic friction, wherein the first component has the protective coating near the at least one point of contact.

16. The substrate processing system of claim 15, wherein the second component also has a protective coating near the at least one point of contact comprising nickel (Ni) and a fluoropolymer.

* * * * *